United States Patent
Takahashi et al.

(10) Patent No.: US 6,741,098 B2
(45) Date of Patent: May 25, 2004

(54) HIGH SPEED SEMICONDUCTOR CIRCUIT HAVING LOW POWER CONSUMPTION

(75) Inventors: Hiroshi Takahashi, Ibaraki (JP); Yutaka Toyonoh, Ibaraki (JP); Akihiro Takegama, Ibaraki (JP); Osamu Handa, Tokyo (JP); Rimon Ikeno, Ibaraki (JP); Kaoru Awaka, Ibaraki (JP); Tsuyoshi Tanaka, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/884,662

(22) Filed: Jun. 19, 2001

(65) Prior Publication Data

US 2002/0190752 A1 Dec. 19, 2002

(51) Int. Cl.$^7$ ................................. H03K 3/01
(52) U.S. Cl. ......................... 326/81; 326/119; 327/534
(58) Field of Search ............................ 326/33, 34, 81, 326/83, 119, 121; 327/530, 534, 535

(56) References Cited

U.S. PATENT DOCUMENTS

| | | | | |
|---|---|---|---|---|
| 5,568,062 A | * | 10/1996 | Kaplinsky | 326/27 |
| 6,046,627 A | * | 4/2000 | Itoh et al. | 327/546 |
| 6,907,113 | * | 8/2000 | Teraoka et al. | 307/125 |
| 6,191,615 B1 | * | 2/2001 | Koga | 326/81 |
| 6,232,793 B1 | * | 5/2001 | Arimoto et al. | 326/34 |

* cited by examiner

Primary Examiner—Daniel D. Chang
(74) Attorney, Agent, or Firm—Wade James Brady, III; Frederick J. Telecky, Jr.

(57) ABSTRACT

A semiconductor circuit which can restrain increase in manufacturing cost and layout area to a minimum level and can realize high speed and low power consumption. Bias voltages with different levels are generated corresponding to a mode control signal by a bias voltage supply circuit comprising PMOS transistors P2 and P3 which have different voltages applied to the respective sources and the mode control signal input to the gates. The generated bias voltages are supplied to the n-wells of PMOS transistors. During operation, a bias voltage that is almost the same as the operation voltage is applied to the n-wells of PMOS transistors. During standby, a bias voltage higher than the operation voltage is supplied to the aforementioned n-wells of PMOS transistors. In this way, the driving currents of the transistors can be kept at a high level during operation, while leakage currents of the transistors can be restrained during standby. Consequently, high speed and low power consumption can be realized.

15 Claims, 4 Drawing Sheets

US 6,741,098 B2

HIGH SPEED SEMICONDUCTOR CIRCUIT HAVING LOW POWER CONSUMPTION

FIELD OF THE INVENTION

The present invention pertains to a semiconductor circuit which can realize high speed and reduce power consumption; especially, power consumption during standby.

BACKGROUND OF THE INVENTION

To reduce power consumption, efforts have been made to reduce power supply voltage in semiconductor circuits, such as semiconductor circuits comprising MOS transistors. When a semiconductor circuit is operated at a low power supply voltage, in order to increase the speed of operation, it is desired to use transistors with low threshold voltages. On the other hand, when transistors with low threshold voltages are used, leakage current is increased. In particular, leakage current during standby increases significantly. As a result, the power consumption of the semiconductor circuit is increased. Consequently, realization of both high speed and low power consumption for portable electronic devices operated with batteries continues to be a problem.

Various technologies have previously been proposed to realize high speed and lower power consumption for semiconductor circuits. FIGS. 8 and 9 show two circuit examples for realizing high speed during operation and low power consumption during standby.

In the semiconductor circuit shown in FIG. 8, in order to realize high speed during operation, PMOS transistor P10 and NMOS transistor N10 with low threshold voltages are used. A logic circuit, such as an inverter, is constituted with PMOS transistor P10 and NMOS transistor N10. In this case, since MOS transistors with low threshold voltages are used, high-speed response characteristics can be realized even if the power supply voltage is at a low level, such as 1.5 V. However, since MOS transistors with low threshold voltages are used, the current that passes through transistors P10 and N10 is increased. In particular, leakage current of transistors P10 and N10 increases, leading to increase in power consumption. In order to solve this problem, the threshold voltages of these transistors are controlled by supplying different bias currents to transistors P10 and N10 during operation and standby.

As shown in FIG. 8, a threshold control voltage supply circuit 10 is used to supply a bias voltage $V_{bsp}$ to the well of PMOS transistor P10 and supply a bias voltage $V_{bsn}$ to the well of NMOS transistor N10. During operation, the threshold voltages of both transistors P10 and N10 are kept at low levels by using bias voltages $V_{bsp}$ and $V_{bsn}$ to realize high speed. On the other hand, during standby, the threshold voltages of both transistors P10 and N10 are kept at high levels by using bias voltages $V_{bsp}$ and $V_{bsn}$ to reduce leakage current in order to reduce power consumption.

In the circuit example shown in FIG. 9, an NMOS transistor N22 used for restraining leakage current during standby is connected in series with an inverter comprising PMOS transistor P20 and NMOS transistor N20 with low threshold voltages. Said transistor N22 has a high threshold voltage, and its on/off state is switched corresponding to a standby signal SDB.

During operation, the standby signal SDB is kept at a high level, such as a voltage higher than the threshold voltage of transistor N22, so that transistor N22 is kept in the on state. As a result, the source of transistor N20 is connected to ground potential GND via transistor N22, and the inverter comprising transistors P20 and N20 with low threshold voltages can display high-speed response characteristics. On the other hand, during standby, the standby signal SDB is kept at a level lower than the threshold voltage of transistor N22, such as 0 V. As a result, transistor N22 is in an off state, and the path of leakage current is cut off so that power consumption during standby can be reduced.

In the aforementioned conventional semiconductor circuits, however, in order to form transistors, the well structure is complicated by forming triple wells. Also, it is necessary to significantly change the manufacturing process. The number of manufacturing steps is increased because the number of masks is increased, and the manufacturing cost is also increased. In the semiconductor circuit shown in FIG. 8, since different bias voltages are supplied to the PMOS transistor and NMOS transistor, it is necessary to include a booster in the threshold control voltage supply circuit. As a result, both the layout area of the circuit and the power consumption are increased. In the semiconductor circuit shown in FIG. 9, since it is necessary to form NMOS transistors with different threshold voltages, the number of steps in the process is increased. On the other hand, in order to restrain leakage current during standby, an NMOS transistor used as a switching transistor is connected in series with the current path. This is undesired for realizing high speed. Also, when the number of transistors increases, the layout area is increased significantly.

The objective of this invention is to solve the aforementioned problems by providing a semiconductor circuit which can realize high speed and low power consumption while keeping the increase in manufacturing cost and layout area at a minimum level.

SUMMARY OF THE INVENTION

A semiconductor circuit having a logic circuit, which includes a MOS transistor, and a bias voltage supply circuit which selectively supplies a first bias voltage or a second bias voltage which are different from each other to the substrate region of the aforementioned MOS transistor corresponding to a control signal.

In the present invention, preferably, the aforementioned bias voltage supply circuit includes a first MOS transistor connected between a first voltage supply line and a bias voltage supply line and a second MOS transistor connected between a second voltage supply line and the aforementioned bias voltage supply line, and the aforementioned first or second bias voltage is output from the aforementioned bias voltage supply line by turning on the aforementioned first MOS transistor or second MOS transistor.

Also, in the present invention, preferably, the MOS transistor of the aforementioned logic circuit is connected to the aforementioned first voltage supply line.

In addition, in the present invention, preferably, the MOS transistor of the aforementioned logic circuit as well as the aforementioned first MOS transistor and second MOS transistor are PMOS transistors.

Moreover, in the present invention, preferably, the aforementioned logic circuit includes NMOS transistors connected between the aforementioned PMOS transistors and a third voltage supply line, and the aforementioned first voltage is lower than the aforementioned second voltage.

DETAILED DESCRIPTION OF PREFERRED EMBODIMENTS

Figure 1:
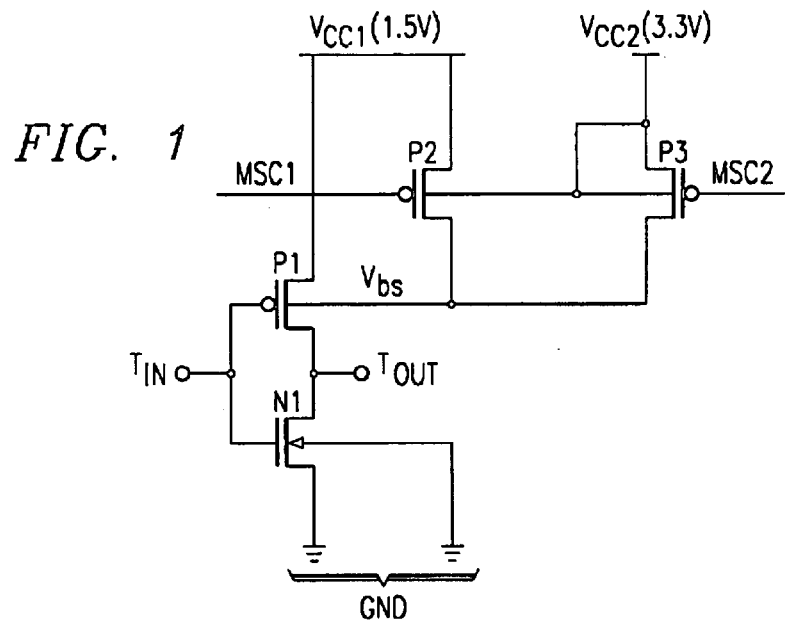
FIG. 1 is a circuit diagram illustrating an embodiment of the present invention.

FIG. 1 is a circuit diagram illustrating an embodiment of the semiconductor circuit disclosed in the present invention.

Figure 2:
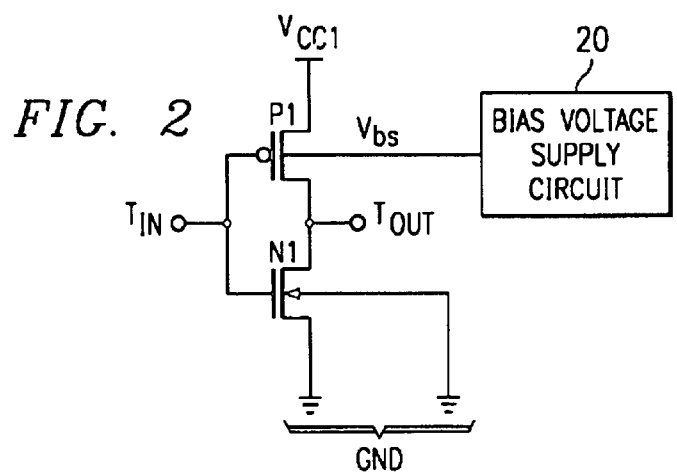
FIG. 2 is a circuit diagram illustrating the equivalent circuit of the semiconductor circuit of the present embodiment.

As shown in the figure, the semiconductor circuit of the present embodiment comprises a logic circuit, such as an inverter, which comprises PMOS transistor P1 and NMOS transistor N1, and a bias voltage supply circuit which supplies a bias voltage to PMOS transistor P1. FIG. 2 shows the equivalent circuit of the semiconductor circuit of the present embodiment.

PMOS transistor P1 and NMOS transistor N1 are connected in series between the supply line of power supply voltage $V_{cc1}$ and ground potential GND. The gates of transistors P1 and N1 are connected to the input terminal $T_{IN}$. The source of transistor P1 is connected to the supply line of power supply voltage $V_{cc1}$, and the drain is connected to output terminal $T_{OUT}$. The source of transistor N1 is grounded, and the drain is connected to output terminal $T_{OUT}$. In this case, PMOS transistor P1 is a transistor with a low threshold voltage or a short-channel transistor, while NMOS transistor N1 has a standard threshold voltage. Therefore, both the driving current and leakage current of PMOS transistor P1 are larger. On the other hand, NMOS transistor N1 has a normal current driving ability, and leakage current can be kept small without applying a special bias voltage to the well. In the semiconductor circuit of the present embodiment, when an appropriate bias voltage is supplied to the well of PMOS transistor P1, a large driving current can be maintained during operation, and leakage current can be restrained during standby.

Bias voltage supply circuit 20 comprises two PMOS transistors P2 and P3. The source of transistor P2 is connected to the supply line of power supply voltage $V_{cc1}$, and the drain is connected to the substrate side (n-well) of transistor P1. The source of transistor P3 is connected to the supply line of power supply voltage $V_{cc2}$, and the drain is connected to the n-well of transistor P1. Both n-wells of transistors P2 and P3 are connected to the supply line of power supply voltage $V_{cc2}$. A mode control signal MSC1 is applied to the gate of transistor P2, and a mode control signal MSC2 is applied to the gate of transistor P3.

Power supply voltage $V_{cc1}$ is the operating power supply voltage of the semiconductor circuit, such as 1.5 V. Power supply voltage $V_{cc2}$ is the power supply voltage supplied to the interface circuit between the semiconductor circuit and the external circuit. It has a higher value than the operating power supply voltage $V_{cc1}$ of the semiconductor circuit, such as 3.3 V.

In the following, operation of the semiconductor circuit of the present embodiment will be explained. The semiconductor circuit of the present embodiment, for example, has two operating modes, that is, operation mode and standby.

Figure 3:
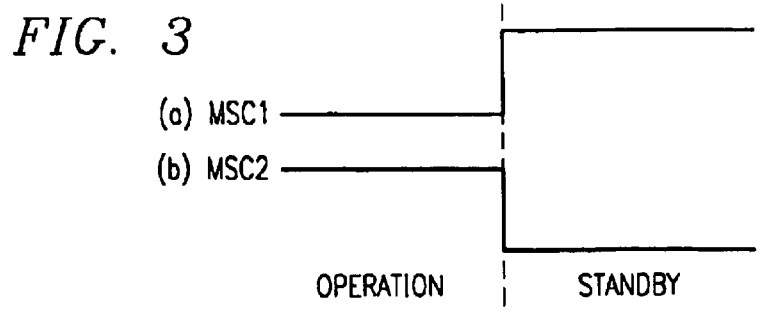
FIG. 3 is a diagram illustrating the waveforms of the mode control signals during operation and standby of the semiconductor circuit of the present embodiment.

FIG. 3 shows mode control signals MSC1 and MSC2 in these operating states. As shown in the figure, in the operation state, mode control signal MSC1 is kept at a low level, such as the ground potential GND level, while MSC2 is kept at a high level, such as the power supply voltage $V_{cc2}$. On the other hand, in the standby, mode control signal MSC1 is kept at a high level, while MSC2 is kept at a low level. That is, mode control signals MSC1 and MSC2 are logically reversed control signals.

In the operational state, transistor P2 is turned on, while transistor P3 is turned off. Therefore, a well bias voltage $V_{bs}$ that is almost equal to the power supply voltage $V_{cc1}$ is applied to the n-well of transistor P1. On the other hand, during standby, transistor P2 is off, while transistor P3 is on. Therefore, a well bias voltage $V_{bs}$ that is almost equal to the power supply voltage $V_{cc2}$ is applied to the n-well of transistor P1.

The level of the bias voltage $V_{bs}$ of PMOS transistor P1 is controlled corresponding to the operating mode of the semiconductor circuit. Since the threshold voltage of PMOS transistor P1 is controlled corresponding to the well bias voltage $V_{bs}$, the current characteristic of PMOS transistor P1 is controlled corresponding to the level of the bias voltage $V_{bs}$. For example, during operation, a bias voltage that is almost equal to the operation power supply voltage $V_{cc1}$ is applied to PMOS transistor P1. As a result, the threshold voltage of the transistor is controlled at a low level to maintain a large driving current. On the other hand, during standby, a bias voltage higher than the operation power supply voltage $V_{cc1}$, such as the power supply voltage $V_{cc2}$ supplied to the interface circuit, is applied to PMOS transistor P1. As a result, the threshold voltage is controlled at a high level to reduce leakage current.

As described above, in bias voltage supply circuit 20 of the present embodiment, since the internal operation power supply voltage $V_{cc1}$ of the semiconductor circuit and the power supply voltage $V_{cc2}$ which is supplied to the interface circuit and is higher than the internal power supply voltage $V_{cc1}$ are used to generate bias voltage $V_{bs}$, there is no need for a booster, and increase in layout area can be restrained.

Figure 4:
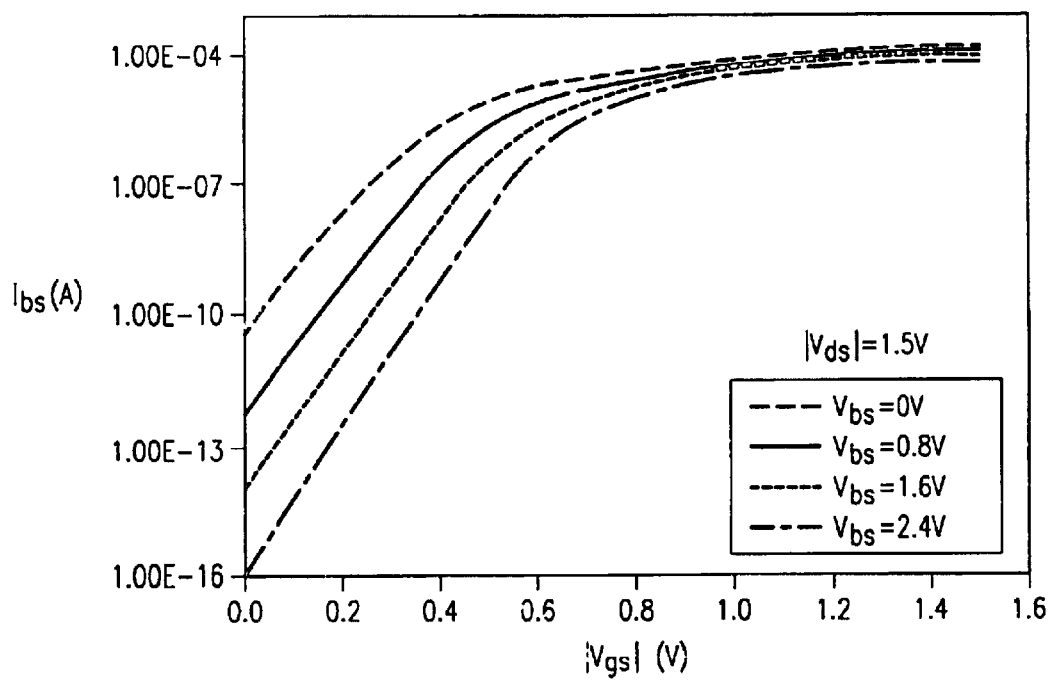
FIG. 4 is a diagram illustrating the relationship between current and bias voltage of a PMOS transistor.

FIG. 4 shows the relationship between current $I_{ds}$ which flows through PMOS transistor P1 and bias voltage $V_{bs}$ as well as gate-source voltage $|V_{gs}|$. In this example, the voltage $|V_{ds}|$ applied between the gate and drain of transistor P1 is the power supply voltage $V_{cc1}$, that is, 1.5 V.

As shown in the figure, the current $I_{ds}$ of transistor P1 varies corresponding to the gate-source voltage $|V_{gs}|$. As the gate-source voltage $|V_{gs}|$ increases, current $I_{ds}$ increases. If the gate-source voltage $|V_{gs}|$ is constant, current $I_{ds}$ varies corresponding to the bias voltage $V_{bs}$. As bias voltage $V_{bs}$ increases, current $I_{ds}$ decreases. In particular, when the gate-source voltage $|V_{gs}|$ drops to turn off transistor P1, the dependency of current $I_{ds}$ on bias voltage $V_{bs}$ increases. That is, when transistor P1 is in the off state, leakage current is strongly dependent on bias voltage $V_{bs}$. The semiconductor circuit of the present embodiment focuses on PMOS transistor characteristics, and by setting the bias voltage $V_{bs}$ applied to transistor P1 during standby at a high level, leakage current can be reduced, and low power consumption during standby can be realized. As described above, during operation, a bias voltage $V_{bs}$ that is almost the same as the power supply voltage $V_{cc1}$ is applied to the well of transistor P1 to increase the driving current. On the other hand, during standby, by applying a bias voltage $V_{bs}$ higher than the power supply voltage $V_{cc1}$ to the well of the transistor P1, leakage current can be reduced during standby, and power consumption can be reduced.

Figure 5:
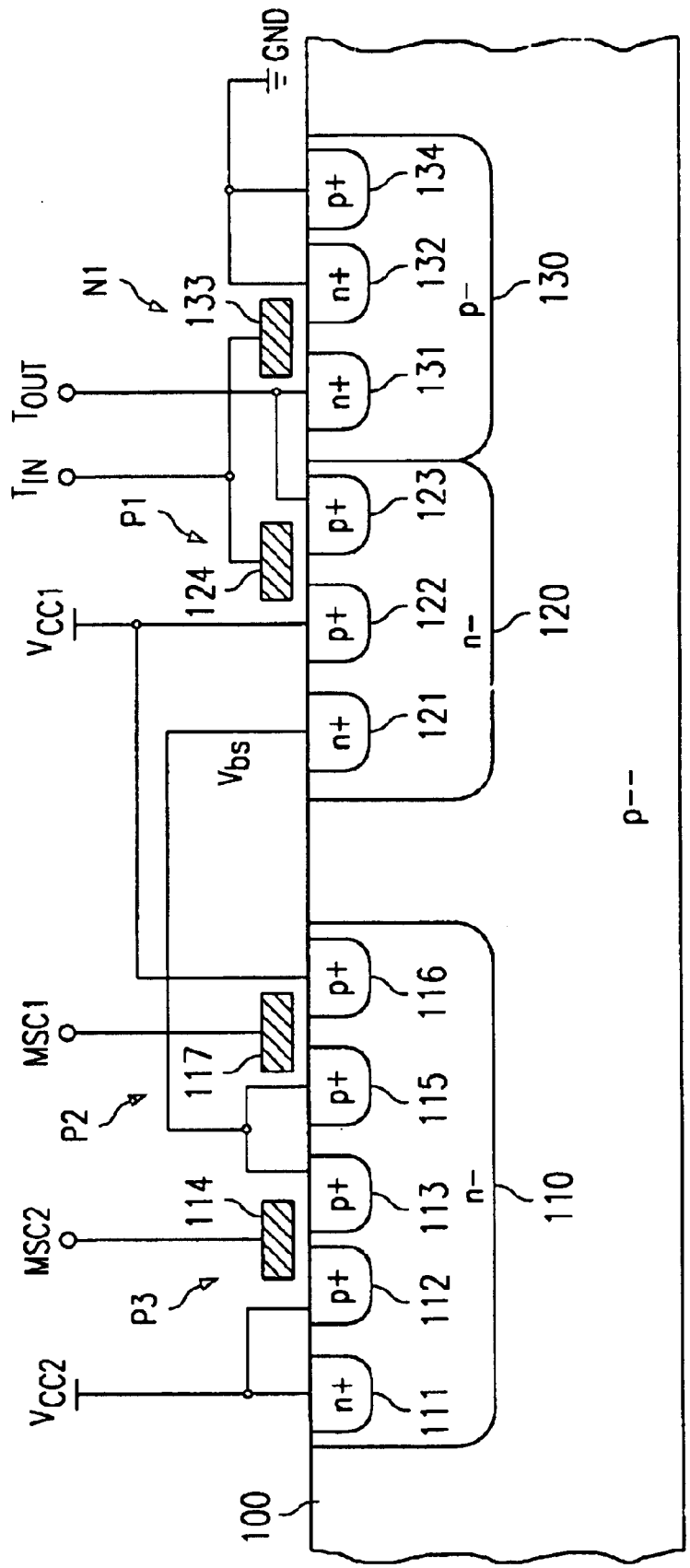
FIG. 5 is a broad cross-sectional view illustrating the configuration of the semiconductor circuit of the present embodiment.

FIG. 5 is a cross-sectional view, which broadly shows the semiconductor circuit of the present embodiment. As shown in the figure, n-type wells (referred to as n-wells hereinafter) 110 and 120 as well as p-type wells (referred to as p-wells hereinafter) 130 are formed in a low-concentration p-type substrate (referred to as p substrate hereinafter) 100.

In n-well 110, n-type impurity region 111 and p-type impurity regions 112, 113, 115, and 116 are formed in portions near the surface of the substrate. Also, gate 114 made of an electroconductive film, such as a metal film or a polysilicon film, is formed on an insulating film on the surface of the substrate (not shown in the figure) between p-type impurity regions 112 and 113. Similarly, gate 117 made of an electroconductive film is formed on an insulating film on the surface of the substrate (not shown in the figure) between impurity regions 115 and 116. PMOS transistor P3 shown in FIG. 1 is formed by gate 114, impurity regions 112 and 113, as well as the channel-forming region between these impurity regions. Impurity region 112 forms the source of transistor P3. Impurity region 113 forms the drain of transistor P3. PMOS transistor P2 is formed by gate 117, impurity regions 115 and 116, as well as the channel-forming region between these impurity regions. Impurity region 116 forms the source of transistor P2. Impurity region 115 forms the drain of transistor P3 [sic; P2].

Power supply voltage $V_{cc2}$ is applied to source 112 of transistor P3, and power supply voltage $V_{cc1}$ is applied to source 116 of transistor P2. Power supply voltage $V_{cc2}$ is also applied to impurity region 111. That is, bias voltage $V_{cc2}$ is applied to the n-well 110 of transistors P2 and P3.

n-type impurity region 121 as well as p-type impurity regions 122 and 123 are formed in n-well 120. Gate 124 made of an electroconductive film is formed on an insulating film on the surface of the substrate (not shown in the figure) between impurity regions 122 and 123. PMOS transistor P1 is formed by gate 124, impurity regions 122 and 123, as well as the channel-forming region between these impurity regions. Impurity region 122 forms the source of transistor P1. Impurity region 123 forms the drain of transistor P1.

n-type impurity regions 131 and 132 as well as p-type impurity region 134 are formed in p-well 130. Gate 133 made of an electroconductive film is formed on an insulating film on the surface of the substrate (not shown in the figure) between impurity regions 131 and 132. NMOS transistor N1 is formed by gate 133, impurity regions 131 and 132, as well as the channel-forming region between these impurity regions. Impurity region 132 forms the source of transistor N1. Impurity region 131 forms the drain of transistor N1.

Power supply voltage $V_{cc1}$ is applied to the source 122 of transistor P1. Also, impurity region 121 is connected to the drains 113 and 115 of PMOS transistors P2 and P3. Bias voltage $V_{bs}$ is applied to the n-well 120 of transistor P1 via impurity region 121.

The source 132 and impurity region 134 of transistor N1 are grounded. That is, the p-well 130 of transistor N1 is biased to the ground potential GND.

The gates 124 and 133 of transistors P1 and N1 are connected to the input terminal $T_{IN}$. The drain 123 of transistor P1 and the drain 131 of transistor N1 are connected to the output terminal $T_{OUT}$. That is, an inverter is formed by transistors P1 and N1. The p-well 130 of transistor N1 is fixed at the ground potential GND, and either power supply voltage $V_{cc1}$ or $V_{cc2}$ is supplied as bias voltage $V_{bs}$ to the n-well 120 of transistor P1 by the bias voltage supply circuit comprising transistors P2 and P3. During operation, bias voltage $V_{bs}$ is set to power supply voltage $V_{cc1}$. Consequently, the driving current of transistor P1 can be increased, and a high speed can be realized for the semiconductor circuit. During standby, bias voltage $V_{bs}$ is set to power supply voltage $V_{cc2}$ which is higher than power supply voltage $V_{cc1}$. Consequently, the leakage current of transistor P1 can be restrained, and low power consumption can be realized.

Since bias voltage supply circuit 20 supplies bias voltage $V_{bs}$ to the well of the PMOS transistor, the supplied current is small, and the power consumption is low. Consequently, the channel size of transistors P2 and P3 that constitute bias voltage supply circuit 20 can be reduced, and the increase in layout area caused by bias voltage supply circuit 20 can be restrained to a minimal level. Also, bias voltage $V_{bs}$ can be supplied to multiple PMOS transistors by using one bias voltage supply circuit. For example, only one bias voltage supply circuit 20 is set in one CMOS circuit block, and the bias voltage $V_{bs}$ generated by this bias voltage supply circuit 20 can be supplied to all the PMOS transistors in the block. In this way, the proportion of the area occupied by the bias voltage supply circuit in the entire layout area of the semiconductor chip can be reduced.

Figure 6:
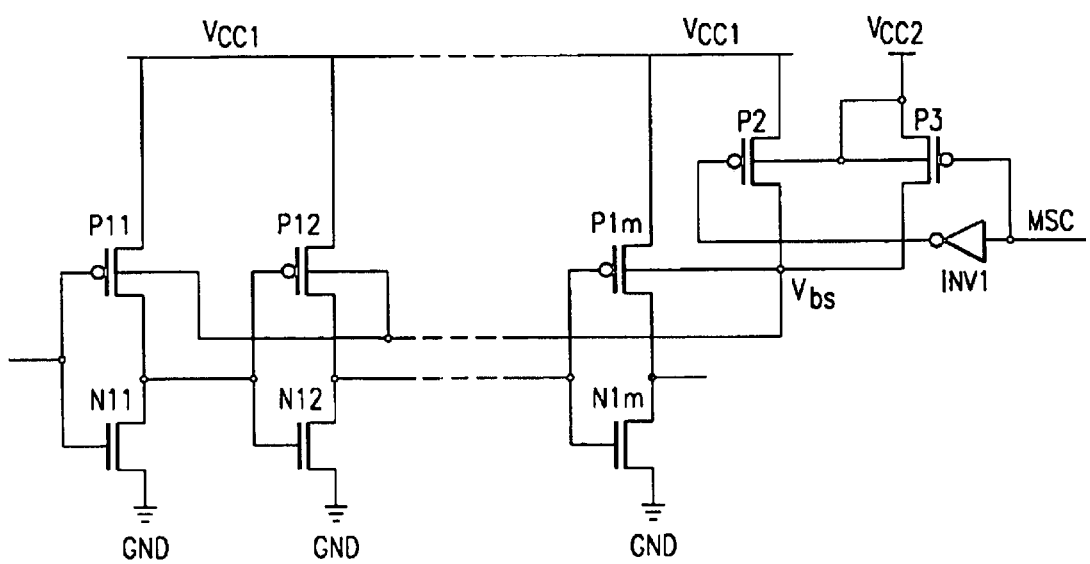
FIG. 6 is a circuit diagram illustrating an embodiment of the semiconductor circuit of the present embodiment.

FIG. 6 shows the configuration of a bias voltage supply circuit 20 shared by multiple PMOS transistors. As shown in the figure, the bias voltage supply circuit comprises transistors P2 and P3. Control signals with reversed logic levels are input to the gates of transistors P2 and P3. During operation, mode control signal MSC is maintained at a high level, transistor P2 is on, and transistor P3 is off. Therefore, the bias voltage $V_{bs}$ is kept at a level that is almost the same as power supply voltage $V_{cc1}$. During standby, mode control signal MSC is kept at a low-level, transistor P2 is off, and transistor P3 is on. Consequently, the bias voltage $V_{bs}$ is kept at a level that is almost the same as power supply voltage $V_{cc2}$.

The bias voltage $V_{bs}$ generated by the bias voltage supply circuit comprising transistors P2 and P3 is supplied to multiple PMOS transistors P11, P12, . . . , P1m (m is a natural number, m>2). As described above, one bias voltage supply circuit is set in one circuit block, and the bias voltage supply circuit is shared by multiple PMOS transistors in the circuit block. In this way, increase in the layout area caused by the bias voltage supply circuit can be restrained.

As explained above, in the semiconductor circuit of the present embodiment, bias voltages with different levels are generated corresponding to the mode control signal by the bias voltage supply circuit comprising PMOS transistors P2 and P3 which have different voltages applied to the respective sources and the mode control signal input to the [respective] gates. The generated bias voltages are supplied to the n-wells of the PMOS transistors. During operation, a bias voltage that is almost the same as the operation voltage is applied to the n-wells of the PMOS transistors. During the standby, a bias voltage higher than the operation voltage is supplied to the aforementioned n-wells. In this way, the driving currents of the transistors can be kept at a high level during operation, while leakage currents of the transistors can be restrained during standby. Consequently, high speed and low power consumption can be realized.

In the semiconductor circuit of the present embodiment shown in FIG. 1, an inverter comprises PMOS transistor P1 and NMOS transistor N1. The semiconductor circuit of the present invention, however, is not limited to this. Other circuits comprising a PMOS transistor and an NMOS transistor, such as a logic gate circuit for performing logic operations, can also be used.

Figure 7:
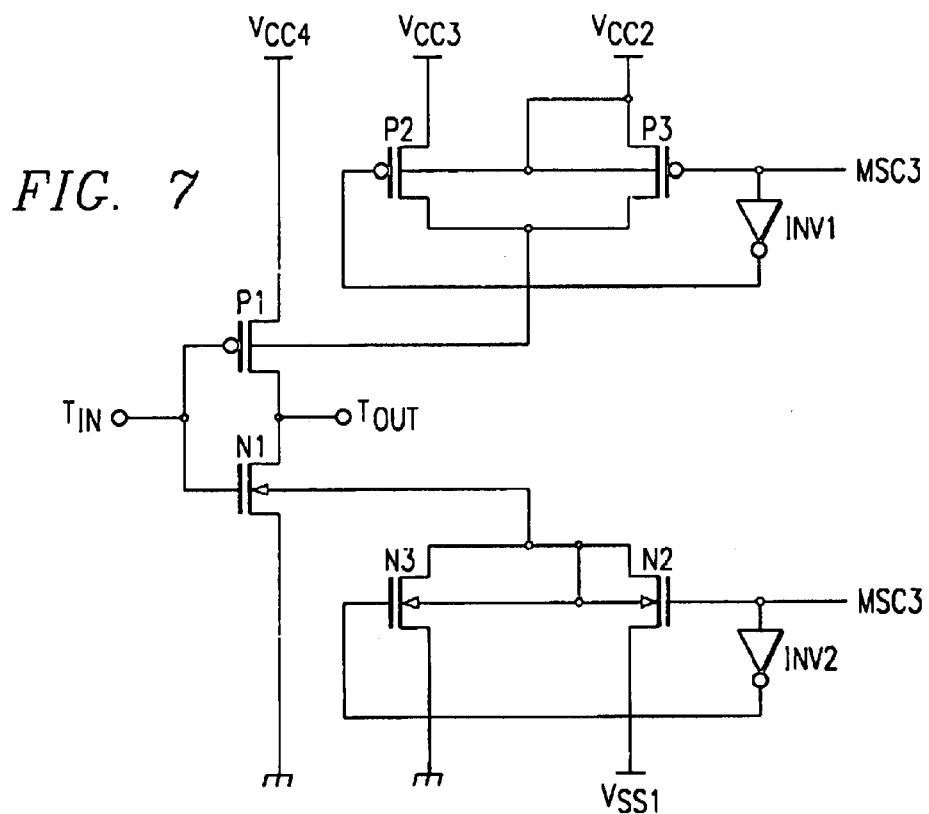
FIG. 7 is a circuit diagram illustrating another embodiment of the semiconductor circuit of the present invention.
Figure 8:
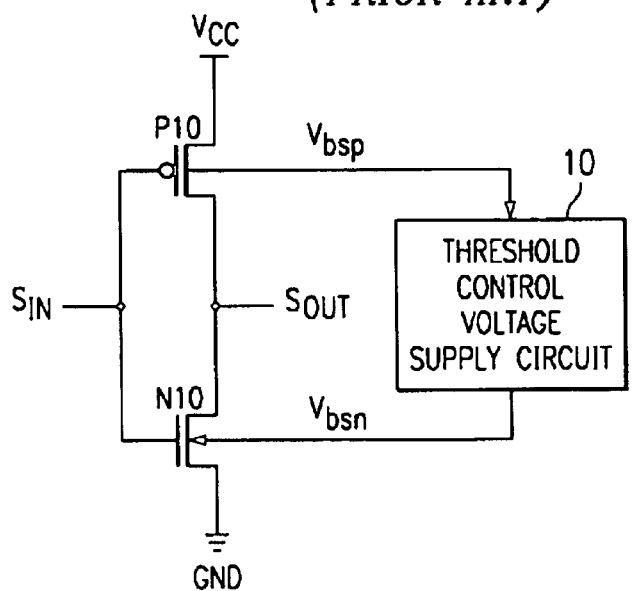
FIG. 8 is a circuit diagram illustrating an example of a conventional semiconductor circuit.
Figure 9:
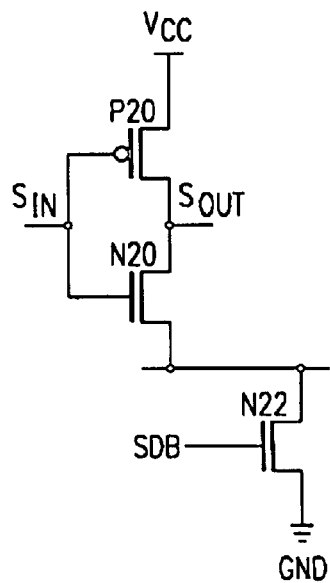
FIG. 9 is a circuit diagram illustrating another example of a conventional semiconductor circuit.

FIG. 7 is a circuit diagram illustrating another embodiment of the present invention. The semiconductor circuit of this embodiment comprises a logic circuit comprising PMOS transistor P1 and NMOS transistor N1, such as an inverter, a first bias voltage supply circuit which supplies bias voltage to PMOS transistor P1, and a second bias voltage supply circuit which supplies bias voltage to NMOS transistor N1. The first bias voltage supply circuit comprises PMOS transistors P2 and P3 as well as inverter INV1. The second bias voltage supply circuit comprises NMOS transistors N2 and N3 as well as inverter INV2.

The source of PMOS transistor P3 is connected to a supply line of power supply voltage $V_{cc2}$. The source of PMOS transistor P2 is connected to a supply line of power supply voltage $V_{cc3}$. The drains of PMOS transistors P2 and P3 are connected to each other and are also connected to the n-well of PMOS transistor P1. The n-wells of PMOS transistors P2 and P3 are connected to each other and are also connected to a supply line of power supply voltage $V_{cc2}$.

The source of NMOS transistor N3 is connected to a supply line of ground potential GND. The source of NMOS transistor N2 is connected to a supply line of power supply voltage $V_{ss1}$. The drains of NMOS transistors N2 and N3 are connected to each other and are also connected to the p-well of NMOS transistor N1. The p-wells of NMOS transistors N2 and N3 are connected to each other and are also connected to the drains of NMOS transistors N2 and N3.

The source of PMOS transistor P1 is connected to a supply line of power supply voltage $V_{cc4}$, and the source of NMOS transistor N1 is connected to a supply line of ground potential GND.

In this case, power supply voltages $V_{cc2}$, $V_{cc3}$, $V_{cc4}$, and $V_{ss1}$ are 3.3 V, 0.6 V, 0.8 V, and 0.2 V, respectively.

The on/off states of PMOS transistors P2 and P3 as well as NMOS transistors N2 and N3 are controlled by control signal MSC3. During operation of the present semiconductor circuit, PMOS transistor P2 and NMOS transistor N2 are in the on state. During standby, PMOS transistor P3 and NMOS transistor N3 are in the on state. During operation, the operation speed can be improved by applying a little forward bias to the substrate sides (n-well or p-well) of PMOS transistor P1 and NMOS transistor N1. During standby, because the n-well of PMOS transistor P1 goes to the power supply voltage level and the p-well of NMOS transistor N1 becomes the ground potential GND level, leakage currents of the two transistors can be restrained.

As explained above, for the semiconductor circuit of the present invention, high speed during operation and low power consumption during standby can be realized by controlling the bias voltages of the transistors during operation and standby.

According to the present invention, the bias voltage supply circuit is only used to correct the bias voltages of the n-wells of the PMOS transistors or the p-wells of the NMOS transistors. Because of low power consumption, the bias voltage supply circuit can be miniaturized, and the increase in layout area can be restrained to a minimum level. Also, during standby, the bias voltage supplied to the n-wells of the PMOS transistors can be generated by using the power supply voltage of the interface circuit. Consequently, there is no need for a booster, and the increase in layout area and power consumption caused by a booster can be avoided.

What is claimed:

1. A semiconductor device, comprising:
   a logic circuit, which includes a pair of complementary serially connected MOS transistors coupled between a voltage supply source and a reference voltage source, the transistor coupled to said reference voltage source having a normally higher threshold voltage and lower leakage and driving current than the normal threshold voltage and leakage current of the other of said complementary serially connected MOS transistors in the operational state, and
   a bias voltage supply circuit which selectively supplies a first bias voltage in the operational state or a second bias voltage in the standby state which are different from each other to the substrate region of the other of said complementary serially connected MOS transistors with substantially no bias voltage supplied to the substrate region of said transistor coupled to said reference voltage source to raise the threshold voltage and diminish the leakage current of the other of said MOS transistors in the standby state.

2. The semiconductor device of claim 1, wherein the bias voltage supply circuit includes a first MOS transistor connected between a first voltage supply line and a bias voltage supply line and a second MOS transistor connected between a second voltage supply line and the bias voltage supply line, and said first or second bias voltage is output from the bias voltage supply line by turning on the first MOS transistor or second MOS transistor.

3. The semiconductor device of claim 1, wherein the MOS transistors of the logic circuit is an NMOS transistor and the other transistor of said logic circuit is a PMOS transistor.

4. The semiconductor device of claim 1, wherein one said bias voltage is above the threshold voltage of said other of said complementary serially connected MOS transistors and the other said bias voltage is below the threshold voltage of said other of said complementary serially connected MOS transistors.

5. The semiconductor device of claim 1, further including at least one additional logic circuit coupled to the bias voltage supply circuit.

6. A semiconductor device, comprising:
   a logic circuit comprising a first MOS transistor and a second MOS transistor connected in series between the supply line of a power supply voltage and ground potential, a substrate region of said second MOS transistor being permanently coupled to ground potential, the second transistor having a normally lower leakage and driving current than the normal threshold voltage and leakage current of the first MOS transistor; and
   a bias voltage supply circuit which selectively supplies a first bias voltage in the operational state or a second bias voltage in the standby state which are different from each other to the substrate region of the first MOS transistor with substantially no bias voltage supplied to the substrate region of said second transistor to raise the threshold voltage and diminish the leakage current of the first MOS transistor in the steady state.

7. The semiconductor device of claim 6, wherein the first MOS transistor is a PMOS transistor and the second MOS transistor is an NMOS transistor.

8. The semiconductor circuit of claim 6, wherein the first bias voltage is lower than the second bias voltage.

9. The semiconductor circuit of claim 6, wherein the bias voltage supply circuit includes a first MOS transistor connected between a first voltage supply line and a bias voltage supply line and a second MOS transistor connected between a second voltage supply line and the bias voltage supply line, and said first or second bias voltage is output from the bias voltage supply line by turning on the first MOS transistor or second MOS transistor.

10. The semiconductor circuit of claim 9, wherein the MOS transistor of the logic circuit is connected to the first voltage supply line.

11. The semiconductor circuit of claim 10, wherein the first MOS transistor of the logic circuit and the first MOS transistor and second MOS transistor of the bias voltage circuit are PMOS transistors.

12. The semiconductor circuit of claim 11, wherein the logic circuit includes an NMOS transistor connected between the PMOS transistor of the logic circuit and a third voltage supply line.

13. A semiconductor device, comprising:

a logic circuit comprising a first MOS transistor and a second MOS transistor connected in series between the supply line of a power supply voltage and ground potential, a substrate region of said second MOS transistor being permanently coupled to ground potential, the second transistor having a normally higher threshold voltage than the normal threshold voltage of said first MOS transistor, and a bias voltage supply circuit which selectively supplies a first bias voltage in the operational state or a second bias voltage in the standby state which are different from each other to the substrate region of the first MOS transistor with substantially no bias voltage supplied to the substrate region of said transistor coupled to said reference voltage source to raise the threshold voltage and diminish the leakage current of the other of said MOS transistors in the standby state.

14. The semiconductor circuit of claim 13, wherein the first bias voltage is lower than the second bias voltage.

15. The semiconductor device of claim 13 wherein one of said bias voltages be above the threshold voltage of the first MOS transistor and the other of the bias voltages be below the threshold voltage of said first MOS transistor.

* * * * *